(12) United States Patent
Futakuchi (10) Patent No.: US 6,308,938 B1
(45) Date of Patent: Oct. 30, 2001

(54) SEMICONDUCTOR INTEGRATED CIRCUIT DEVICE (75) Inventor: Michio Futakuchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 149 days.

(21) Appl. No.: 09/016,398

(22) Filed: Jan. 30, 1998

(30) Foreign Application Priority Data

Sep. 26, 1997 (JP) .................................................. 9-262049

(51) Int. Cl.$^7$ ...................................................... H01L 23/48
(52) U.S. Cl. ............................ 259/780; 257/780; 257/783
(58) Field of Search ..................................... 257/738, 780, 257/783, 690; 361/760

(56) References Cited

U.S. PATENT DOCUMENTS

| 5,172,303 | 12/1992 | Bernardoni et al. | 361/396 |
| 5,222,014 | 6/1993 | Lin | 361/414 |
| 5,293,067 | 3/1994 | Thompson et al. | 257/668 |
| 5,572,405 | 11/1996 | Wilson et al. | 361/705 |
| 5,586,010 | 12/1996 | Murtuza et al. | 361/751 |
| 5,640,048 | * 6/1997 | Selna | 257/738 |
| 5,650,918 | * 7/1997 | Suzuki | 361/760 |
| 5,726,493 | * 3/1998 | Yamashita et al. | 257/698 |
| 5,798,567 | * 8/1998 | Kelly et al. | 257/723 |
| 5,835,355 | * 11/1998 | Dordi | 361/760 |

FOREIGN PATENT DOCUMENTS

| 44 11 210 | 3/1994 | (DE) . |
| 7-3212246 | 12/1995 | (JP) . |
| 9-167811 | 6/1997 | (JP) . |

OTHER PUBLICATIONS

Nikkei Electronics, No. 695, Jul. 1997, pp. 19–20.

* cited by examiner

Primary Examiner—Olik Chaudhuri
Assistant Examiner—Douglas A. Wille
(74) Attorney, Agent, or Firm—Leydig, Voit, & Mayer,Ltd.

(57) ABSTRACT

A semiconductor integrated circuit device having a ball grid array package includes a core material including a semiconductor chip and a sealing resin layer surrounding the chip and surface materials including a carrier base and a reinforcement in a sandwich structure for high stiffness against being and high reliability of connection to a printed wiring board even during heat cycling.

23 Claims, 7 Drawing Sheets

SURFACE 3(a)

FIGURE 2 (b)

SURFACE 3(b)

SEMICONDUCTOR INTEGRATED CIRCUIT DEVICE

BACKGROUND OF THE INVENTION

1. Field of the Invention

The present invention relates to a semiconductor integrated circuit device which has a ball grid array structure, package particularly to a semiconductor integrated circuit device having reliable on connections between the semiconductor integrated circuit device and a printed-wiring board on which the semiconductor integrated circuit device is mounted. Further, the present invention relates to a semiconductor integrated circuit device which is thin and has a high bending stiffness.

2. Discussion of Background

In recent years, the number of pins used in a semiconductor integrated circuit device has been increasing. Therefore, a package (hereinbelow, referred to as BGA 20 package) having a ball grid array structure is conventionally used, wherein conductive terminals having a spherical-shape, as an external connection terminal, are formed in a grid array. Such a BGA package is paid attention to because this package can satisfy increasing requirements for the packages, such as an increment in the number of pins, miniaturization, and a thin body.

Figure 9:
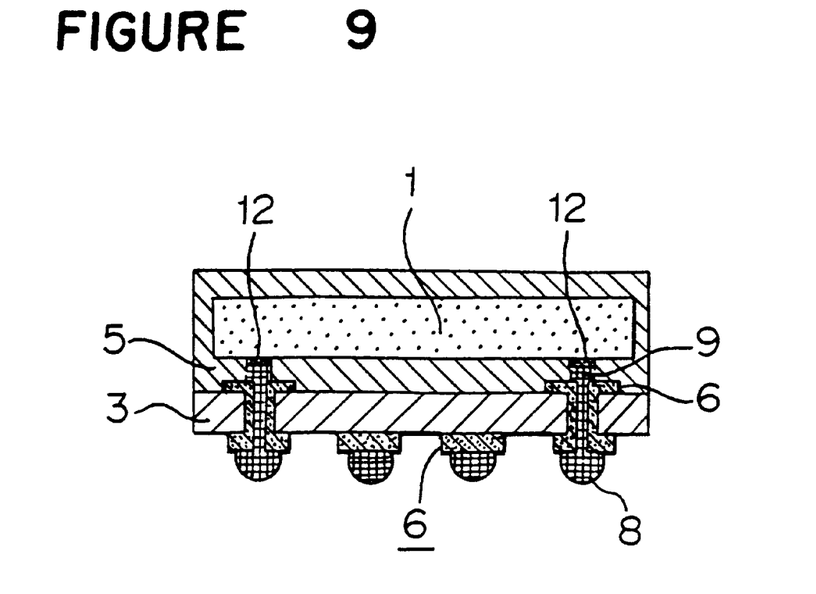
FIG. 9 is a cross-sectional view showing a conventional semiconductor integrated circuit device.
Figure 10:
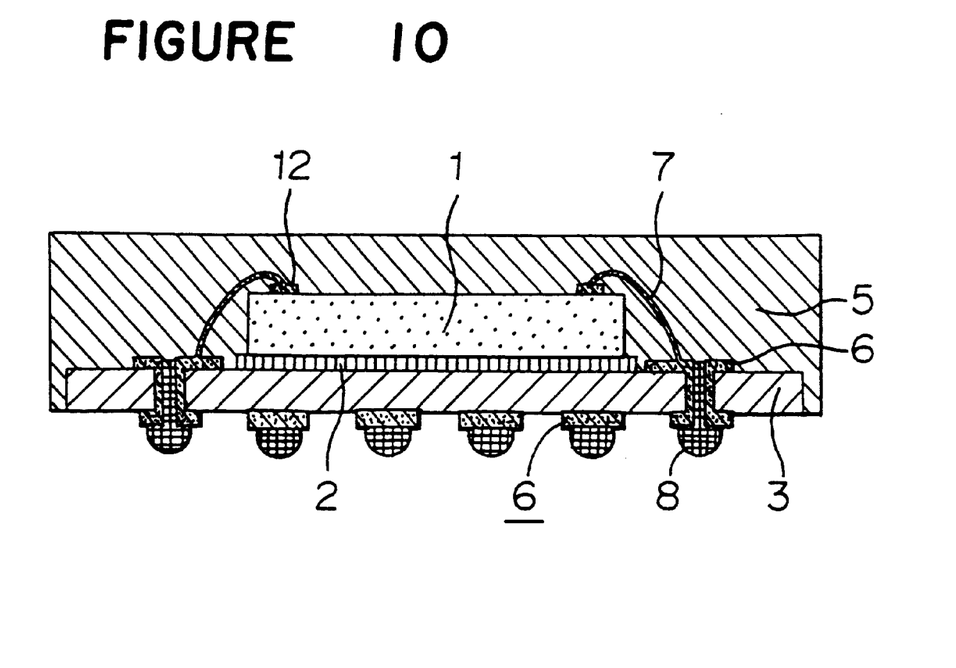
FIG. 10 is a cross-sectional view showing a conventional semiconductor integrated circuit device.

FIGS. 9 and 10 respectively show structures of conventional BGA packages. The BGA package shown in FIG. 9 has a conductive pad provided on a principal surface of semiconductor chip 1 electrically connected to a conductors 6 through a conductive adhesive 9 at one surface side of a carrier base 3, and external output terminals 8 are provided on the conductor 6 at the other surface side of the carrier base 3.

On the other hand, the BGA package shown in FIG. 10 has a bonding pad provided on a principal surface of semiconductor chip 1 electrically connected to conductors 6 through bonding wires 7 to one surface side of a carrier base 3, and external output terminals 8 are provided on the conductor 6 at the other surface side of the carrier base 3.

In FIGS. 9 and 10, numeral 2 designates a die pad, and numeral 5 designates a sealing resin layer.

However, it has been pointed out recently that there is a problem of reliability on connection between such a BGA package and a printed-wiring board on which the BGA package is mounted. For example, in Nikkei Electronics (vol. 1997.7.28 (No. 695), pages 19 through 20), it is reported that because of a difference between a coefficient of thermal expansion of a semiconductor chip made of silicon 1 and that of an interposer (hereinbelow, referred to as carrier base) on which the semiconductor chip is directly installed, the largest deformation occurs at a central portion of BGA package, corresponding to a lower portion of the semiconductor chip 1, after a heat cycle test is conducted, and therefore solder balls connecting the package to a printed-wiring board, in which the package is equipped with, are apt to break by fatigue.

Figure 11:
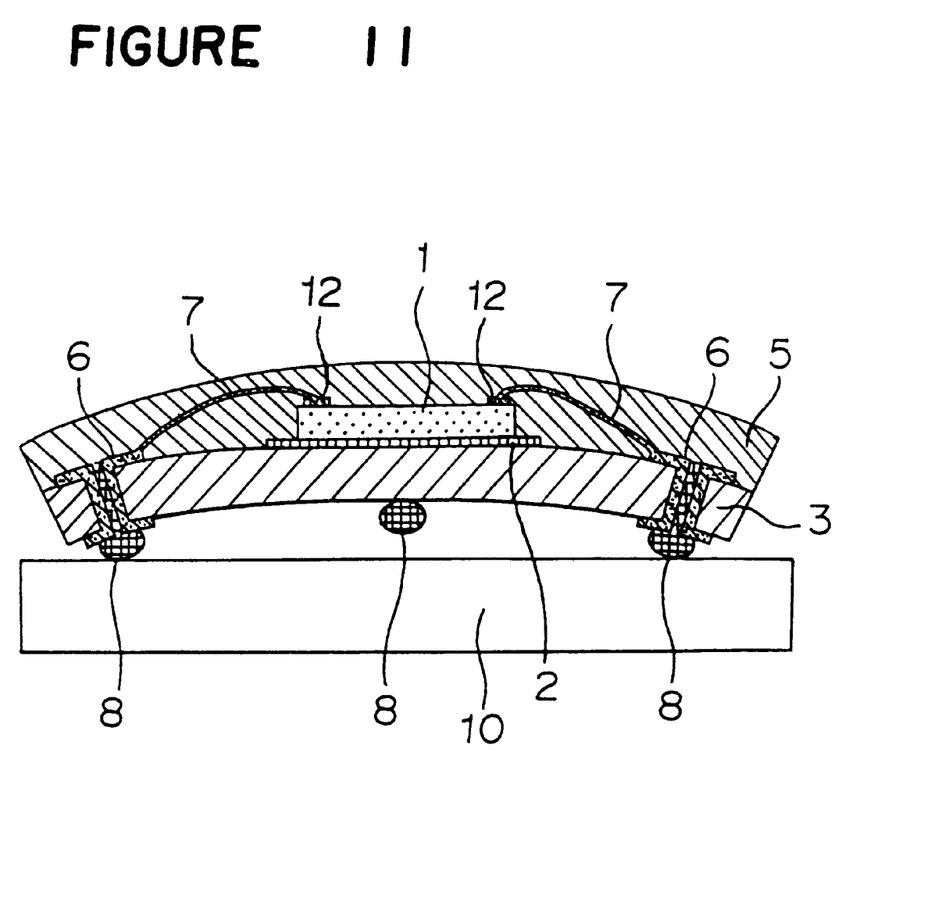
FIG. 11 is a cross-sectional view schematically showing deformation of a conventional semiconductor integrated circuit device caused by a heat cycle.

Specifically, as shown in FIG. 11, there was a phenomenon that a central portion at a side other than the side in which a semiconductor chip 1 is provided (namely, at the side in which external connection terminals 8 are provided) cambers when a carrier base 3 has a larger coefficient of thermal expansion than that of the semiconductor chip 1. The external connection terminals 8 of solder balls in the central portion receive a large load, therefore, that a crack is caused at an interface between the solder balls 8 in the central portion and the printed-wiring board 10 or in the solder balls 8 themselves. Thus the package was destroyed.

On the other hand, in order to evade affects of thermal stress caused by the difference between the coefficient of thermal expansion of the carrier base 3 and that of the printed-wiring board 10, it was proposed to use fiber-reinforced plastics for the carrier base 3. However, when the carrier base 3 made of fiber-reinforced plastics was used, the deformation of the central portion of BGA package caused by the difference of the coefficients of thermal expansion became large, whereby a problem of reliability of connections against deformation became conspicuous.

In the next approach, a ceramic was used for the carrier base 3, sacrificing the effects of thermal stress caused by the difference between the coefficient of thermal expansion of the carrier base 3 and that of the printed-wiring board 10. In this case, the difference between the coefficient of thermal expansion of the semiconductor chip 1 and that of the carrier base 3 was small and the deformation of the BGA package at the central portion thereof caused by the difference between the thermal coefficients became small. However, the deformation can not completely be eliminated and problems such as cracks and breakage in the solder balls 8 have been still existed though the extent of each problem was different.

SUMMARY OF THE INVENTION

The present invention is to solve the above mentioned problems inherent in the prior art. It is an object of the present invention to provide a semiconductor integrated circuit device comprising a BGA package having a high reliability of connection to a printed-wiring on which the package is mounted during heat cycling.

It is another object of the present invention to provide a semiconductor integrated circuit device comprising a BGA package which is thin and has a stiffness strong enough to bear a bending stress.

According to a first aspect of the present invention, there is provided a semiconductor integrated circuit device comprising a semiconductor chip having a plurality of connection pads; a plurality of conductors electrically connected to the plurality of connection pads; and a plurality of external connection terminals of a spherical-shape corresponding respectively to the plurality of conductors, further comprising: a sealing resin layer surrounding a periphery of the semiconductor chip; a carrier base; a reinforcement base, characterized by the semiconductor chip and the sealing resin layer form a core material, the carrier base and the reinforcement base are skin materials, the core material and the skin materials constitute a sandwich structure, the connections of conductors with the connection pads are provided in one surface of the carrier base, the conductors are provided in the other surface of the carrier base, and the external connection terminals are provided in the other surface of the carrier base.

According to a second aspect of the present invention, there is provided a semiconductor integrated circuit device according to the first aspect of the invention, wherein the plurality of connection pads in the semiconductor chip and the plurality of conductors are connected electrically by bending wires, and the semiconductor chip is equipped with by adhering to the surface of the carrier base interposing a die pad which is provided in the carrier base.

According to a third aspect of the present invention, there is provided a semiconductor integrated circuit device according to the first aspect of the invention, wherein the plurality of connection pads in the semiconductor chip and the plurality of conductors are connected electrically interposing conductive adhesive only.

According to a fourth aspect of the present invention, there is provided a semiconductor integrated circuit device according to the first aspect of the invention, wherein the plurality of conductors provided on the other surface of carrier base are arranged in the form of grid array having a plurality of rows and plurality of columns.

According to a fifth aspect of the present invention, there is provided a semiconductor integrated circuit device according to the first aspect of the invention, wherein the reinforcement base is embedded in the sealing resin layer.

According to a sixth aspect of the present invention, there is provided a semiconductor integrated circuit device according to the first aspect of the invention, wherein a distance from a center plane with respect to the thickness direction of semiconductor chip to the reinforcement base is the same as a distance from the center plane to the carrier base.

According to a seventh aspect of the present invention, there is provided a semiconductor integrated circuit device according to the first aspect of the invention, wherein the carrier base and the reinforcement base have the identical shape and are arranged in positions symmetrically with respect to a center plane of the sandwich structure.

According to an eighth aspect of the present invention, there is provided a semiconductor integrated circuit device according to the first aspect of the invention, wherein the carrier base is made of fiber-reinforced plastics.

According to a ninth aspect of the present invention, there is provided a semiconductor integrated circuit device comprising a semiconductor chip having a plurality of connection pads; a plurality of conductors electrically connected to the plurality of connection pads; and a plurality of external connection terminals of a spherical-shape corresponding respectively to the plurality of conductors, further comprising: a first insulating adhesive layer; a second insulating adhesive layer; a carrier base adhered to the semiconductor chip interposing the first insulating adhesive layer; a reinforcement base adhered to the semiconductor chip interposing the second insulating adhesive layer, characterized by the semiconductor chip, the first insulating adhesive layer and the second insulating adhesive layer form a core material, the carrier base and the reinforcement base are skin materials, the core material and the skin material constitute a sandwich structure, the connections of conductors with the connection pads are provided in one surface of the carrier base, the conductors are provided in the other surface of the carrier base, and the external connection terminals are provided in the other surface of the carrier base.

According to a tenth aspect of the present invention, there is provided a semiconductor integrated circuit device according to the ninth aspect of the invention, wherein a sealing resin layer is provided so as to surround the semiconductor chip, the one surface of the carrier base, the first insulating adhesive layer, the second insulating adhesive layer and the reinforcement base.

According to an eleventh aspect of the present invention, there is provided a semiconductor integrated circuit device according to the ninth aspect of the invention, wherein the plurality of conductors provided in the other surface of the carrier base are arranged in the form of grid array having a plurality of rows and plurality of columns.

According to a twelfth aspect of the present invention, there is provided a semiconductor integrated circuit device according to the ninth aspect of the invention, wherein the carrier base and the reinforcement base are in the identical shape, and are arranged in positions symmetrically with respect to a center plane of the sandwich structure.

According to a thirteenth aspect of the present invention, there is provided a semiconductor integrated circuit device according to the ninth aspect of the invention, wherein the carrier base is made of fiber-reinforced plastics.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

A detailed explanation will be given of preferred embodiments of the present invention in reference to FIGS. 1 through 11 as follows, wherein the same numerical references are used for the same or similar portions and description of these portions is omitted.

EXAMPLE 1

Figure 1:
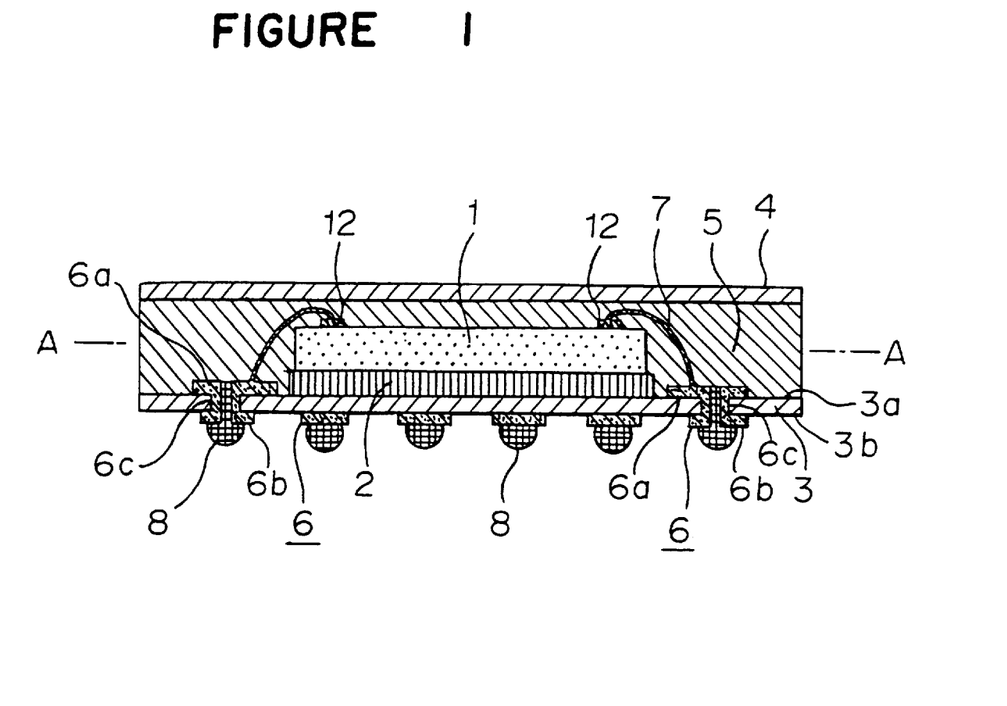
FIG. 1 is a cross-sectional view showing a structure of semiconductor integrated circuit device according to Example 1 of the present invention.

FIG. 1 shows Example 1 of the present invention, wherein numeral 1 designates a semiconductor chip having a plurality of connection pads 12 (i.e. bonding pads) on a principal surface thereof and the semiconductor chip is made of a silicon semiconductor substrate in this Example 1. Numeral 3 designates a carrier base on one surface 3a of which the semiconductor chip is mounted, wherein the carrier base is made of a fiber-reinforced plastic, such as glass fiber epoxy resin, or on alumina ceramic, and has a thickness of 0.2 mm in this Example. Numeral 2 designates a die pad which is adhered to said one surface 3a of the carrier base 3 by adhesive. On the die pad, the semiconductor chip 1 is adhered by die bonding.

Figure 2A:
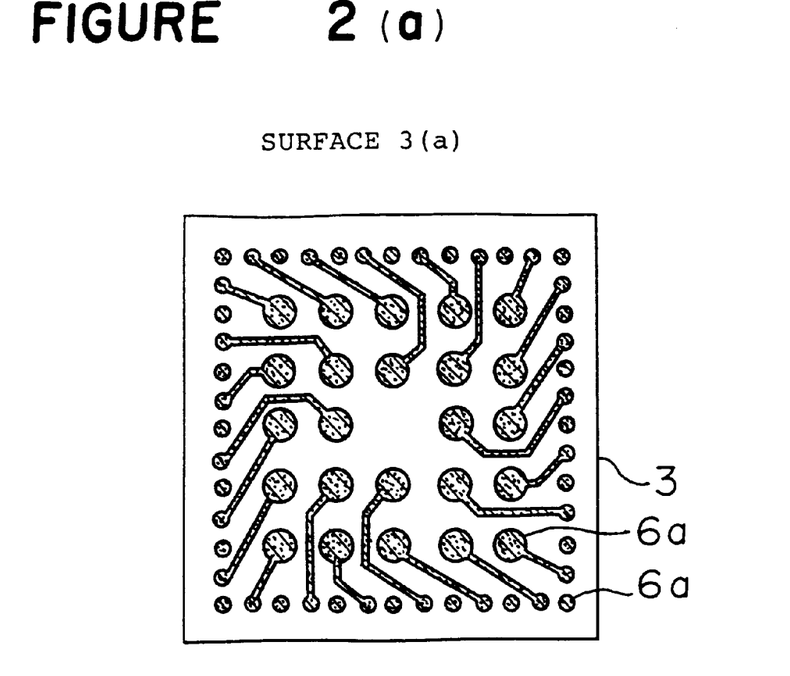
FIGS. 2(a) and 2(b) are plan views showing an arrangement of conductors 6 and external connection terminals 8 according to Example 1 of the present invention.
Figure 2B:
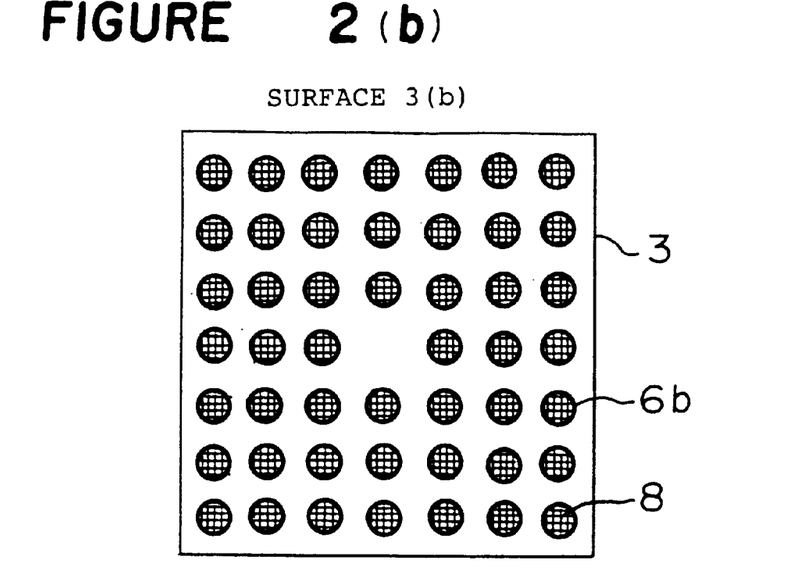

Numeral 6 designates a plurality of conductors corresponding to a plurality of connection pads 12 respectively, which are provided in the semiconductor chip 1 and electrically connected to the respective connection pad 12 corresponding thereto, wherein the conductors have an inner conductor surface 6a positioned on the side of the one surface 3a of the carrier base 3, to which one of the connection pads 12 in the semiconductor chip 1 is electrically connected by a bonding wire 7, and an outer conductor surface 6b positioned in the side of the other surface 3b of the carrier base 3. The inner conductor surface 6a and the outer conductor surface 6b are electrically connected by a connection conductor 6c provided in the inner surface of a through hole formed in the carrier base 3. Further, the inner conductor surface 6a is subjected to patterning on the one surface 3a of the carrier base 3 in a predetermined pattern as shown in FIG. 2(a). The outer conductor surface 6b is formed on the other surface 3b of carrier base 3 in a grid array pattern, namely a matrix pattern having multiple rows and multiple columns, as shown in FIG. 2(b). The conductor 6 can be any conductive material, preferably a metal such as copper, gold, silver, and aluminum.

Numeral 8 designates a plurality of external connection terminals of a spherical-shape which correspond to the plurality of conductors 6 and are connected to the outer conductor surface 6b of the corresponding conductors 6, respectively. The respective external connection terminals 8 are electrically connected to the respective connection pads 12 of the semiconductor chip, through the corresponding conductor 6 and the corresponding bonding wire 7. Numeral 5 designates a sealing resin layer formed by covering the one surface 3a of the carrier base 3 and the semiconductor chip 1 in order to protect the semiconductor chip 1 and the bonding wires 7, wherein the sealing resin layer is ordinarily made of epoxy resin or epoxy resin made by denaturalating silicone resin.

Numeral 4 designates a reinforcement base arranged oppositely to the one surface 3a of the carrier base 3 via the sealing resin layer 5, which reinforcement base is made of the same material as the carrier base 3 or the material having the same coefficient of thermal expansion as that of the carrier base 3, and having the same shape (namely, the same dimensions) as that of the carrier base 3. In Example 1, the reinforcement base is made of a fiber-reinforced plastic, such as glass fiber epoxy resin, or alumina ceramic and has, for example, a thickness of 0.2 mm.

Meanwhile, the sealing resin layer 5 is formed by filling the space between the carrier base 3 and the reinforcement base 4. The sealing resin layer is formed such that the carrier base 3 equipped with the semiconductor chip 1 and the reinforcement base 4 are respectively arranged in a mold, and thereafter the sealing resin layer is added by transfer molding or injection molding, which are commonly used, and cured. Concerning the thickness of sealing resin layer 5, a length (distance) between the central plane of the semiconductor chip 1 in the thickness direction (plane including a line A—A shown in the Figure) and the reinforcement base 4 and a length (distance) between this center plane and a carrier base 3 are the same.

In FIG. 1, the reference numerals designate the same portions as or similar portions to the reference numerals shown in FIG. 9 and 10.

The semiconductor integrated circuit device constructed as such has a sandwich structure composed of a core material including the semiconductor chip 1 and the sealing resin layer 5 and skin materials of the carrier base 3 and the reinforcement base 4.

Accordingly, thermal stress between the semiconductor chip 1 and the carrier base 3 and thermal stress between the semiconductor chip 1 and the reinforcement base 4 occur because of a difference between coefficients of thermal expansion of the semiconductor chip 1 (when the chip is made of silicon, the coefficient of thermal expansion is $4 \times 10^{-6}$ deg$^{-1}$) and the carrier base 3 and a difference between coefficients of thermal expansion between the semiconductor chip 1 and the reinforcement base 4 (when a glass fiber-reinforced epoxy resin is used, the coefficient of thermal expansion is $16 \times 10^{-6}$ deg$^{-1}$ and when the alumina ceramic is used, the coefficient is $8 \times 10^{-6}$ deg$^{-1}$). However, the thermal stress in the upper portion with respect to the center plane in the thickness direction of the semiconductor chip 1 and the thermal stress in the lower portion therein offset each other, whereby deformation caused by thermal stress at a time of heat cycling and so on can be minimized.

Further, as mentioned in the above, since the device has a sandwich structure, it is possible to obtain high bending stiffness which was not obtainable by a structure using the carrier base 3 only. In other words, provided that a bending stress occurs in the semiconductor integrated circuit device, it is possible to restrict the amount of deformation generated to be as small as the amount does not cause problems.

Resultantly, when the so-constructed semiconductor integrated circuit device is mounted on the printed-wiring board, cracks and breakage do not occur in the external output terminal 8.

Specifically, the above-mentioned effect is confirmed by a heat cycle test of a test sample having the structure shown in FIG. 1. Both the carrier base 3 and the reinforcement base 4 are a glass fiber-reinforced epoxy resin having a length of 40 mm, a width of 40 mm and a thickness of 2 mm, and the semiconductor chip 1 is a silicon chip having a length of 15 mm, a width of 15 mm and a thickness of 0.4 mm so that the whole thickness of the test sample is of 1.2 mm, wherein the space between the carrier base 3 and the reinforcement base 4 is filled by the sealing resin 5, an epoxy resin. Further, in the carrier base 3, the patterns as shown in FIGS. 2(a) and 2(b) are formed on surfaces of the carrier base by etching a copper foil of 18 microns thickness. Solder balls having a diameter of about 0.5 mm serve as the external connection terminals 8. The test sample is mounted on a printed-wiring board made of glass fiber-reinforced epoxy resin having a thickness of 1.6 mm. After 1000 cycles of the test from +85° C. through −85° C., no problem could be observed. Simultaneously, a comparative sample which does not have the reinforcement base 4 and in which the carrier base 3 having a thickness of 0.4 mm was subjected to the heat cycle test under the identical conditions, a portion of the balls was disconnected after 1000 cycles.

As mentioned the above, it is possible to obtain a large moment of inertia (I) using a skin materials having high stiffness with respect to a bending stress, arranged at both sides of the sandwich structure and spaced at an interval.

Figure 3:
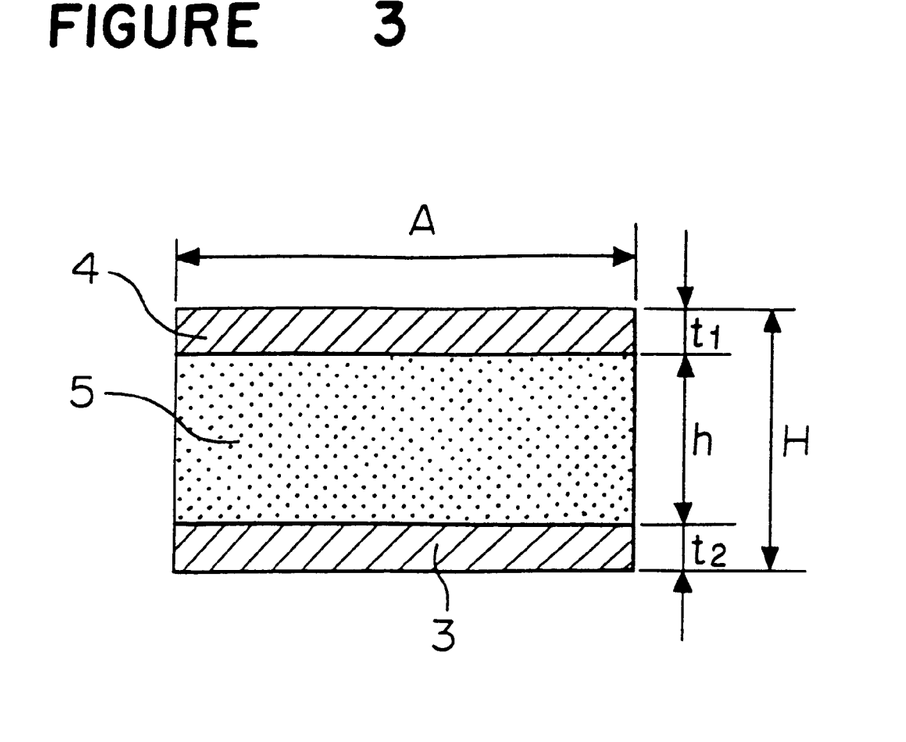
FIG. 3 is a cross-sectional view schematically showing a sandwich structure which is commonly known.
Figure 4:
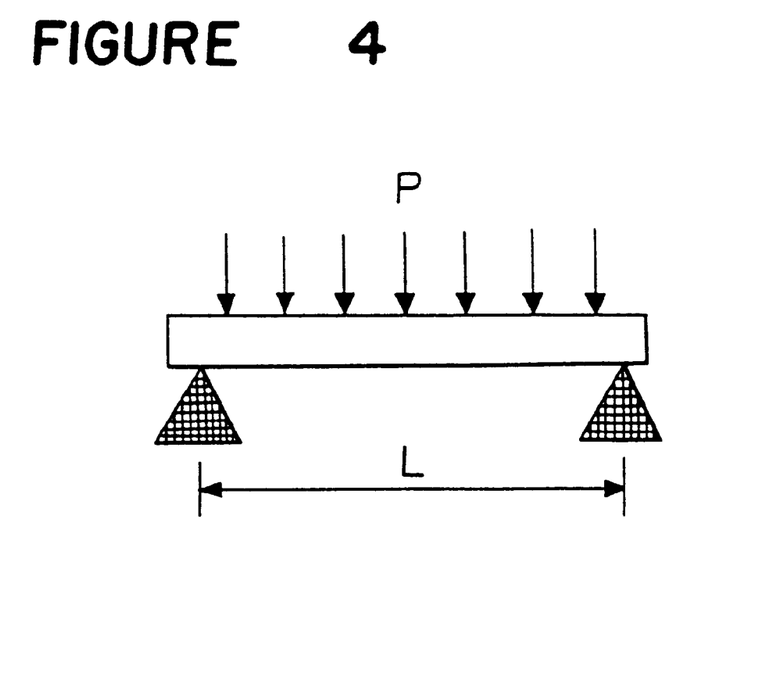
FIG. 4 illustrates a bending test which is commonly known.

This is further explained in reference to FIGS. 3 and 4. FIG. 3 is a cross-sectional view showing a common sandwich structure, and FIG. 4 illustrates a common bending test of the sandwich structure shown in FIG. 3. In the bending test shown in FIG. 4, when the both sides of the sandwich structure are supported and a uniform load P is applied to the whole surface, the maximum flexure in the sandwich structure is in the central portion and the amount of flexure δ is represented by the following Formula 1:

$$\delta = 5PL^3/384EI, \quad \text{[Formula 1]}$$

where δ designates the maximum flexure; P designates a load; L designates distance between the supporting points; reference E designates a modulus of elasticity; and I designates a moment of inertial.

In this, the moment of inertia I is a coefficient representing flexural rigidity and is represented by the following Formula 2 for a beam having a simple structure of a height of H and a width of A;

$$I = AH^3/12 \quad \text{[Formula 2]}$$

Accordingly, in the sandwich structure shown in FIG. 3, the moment of inertia I of skin materials is represented by the following Formula 3:

$$I = (AH^3 - Ah^3)/12 \quad \text{[Formula 3]}$$

In consideration of the above mentioned points, the amount of deformation was obtained as a result of a bending stress applied to the semiconductor integrated circuit device shown in FIG. 1. For the purpose of comparison, the amount of deformation was obtained as a result of a bending stress concerning the conventional semiconductor integrated circuit device shown in FIG. 10.

The semiconductor integrated circuit device shown in FIG. 1 is formed so that the thickness of both the carrier base 3 and the reinforcement base 4 is 0.2 mm; the width A of the device is 40 mm; the thickness H of the device is 1.2 mm; the load P is 1 kgf; the distance L between the supporting points is 40 mm; and the carrier base 3 and the reinforcement base 4 are made of glass fiber-reinforced epoxy resin (E=3000 kgf/mm²). The maximum flexure δ of the semiconductor integrated circuit device prepared as in the above is approximately obtained using a model (corresponding to FIG. 4) which receives the load P caused by the thermal stress applied uniformly on the whole surface of the device.

Meanwhile, the semiconductor integrated circuit device shown in FIG. 10 is identical to the semiconductor integrated circuit device shown in FIG. 1 except that the thickness of carrier base 3 is 0.4 mm.

Consequently, the maximum flexure δ of the semiconductor integrated circuit device shown in FIG. 1 is 0.069 mm from Formula 1 and Formula 3. On the other hand, the maximum flexure δ of the semiconductor integrated circuit device shown in FIG. 10 is 1.3 mm from Formula 1 and Formula 2 (H=0.4 mm). Accordingly, it is apparent that the deformation (the maximum flexure δ), resulting from a bending stress in the semiconductor integrated circuit device having the sandwich structure shown in FIG. 1, is improved in comparison with the semiconductor integrated circuit device shown in FIG. 10 with a reduction in the deformation to about 1/19 (one-nineteenth).

In the example, it is explained that glass fiber-reinforced epoxy resin is used for the carrier base 3 and the reinforcement base 4, a similar effect thereto is obtainable even if materials other than those above mentioned, for example, an alumina ceramic, are used because the effect of improvement in the deformation against a bending stress is obtainable by the moment of inertia I.

As apparently known from the above, in the semiconductor integrated circuit device constructed as in the above, the sandwich structure which is composed of the core material of the semiconductor chip 1 and the sealing resin layer 5, the skin material of the carrier base 3 and the skin material of the reinforcement 4 are formed, whereby high bending stiffness is obtainable. The thermal stress generated between the semiconductor chip 1 and the carrier base 3 and the thermal stress generated between the semiconductor chip 1 and the reinforcement base 4 can substantially be ignored because the thermal stress in the upper portion and the thermal stress in the lower portion, with respect to the center plane in the thickness direction of the semiconductor chip 1, are offset.

EXAMPLE 2

Figure 5:
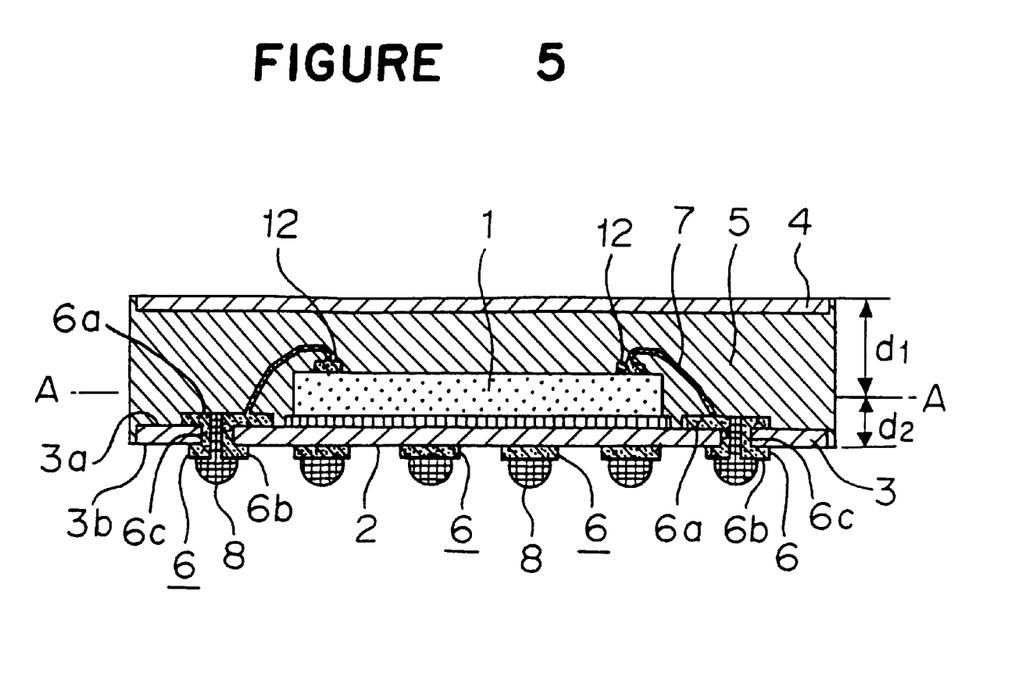
FIG. 5 is a cross-sectional view showing a structure of semiconductor integrated circuit device according to Example 2 of the present invention.

FIG. 5 shows Example 2 of the present invention, wherein the thickness of sealing resin layer is different from that of Example 1 shown in FIG. 1. In the semiconductor integrated circuit device shown in FIG. 1, the length (distance) from the center plane A—A in the thickness direction of the semiconductor chip 1 to the carrier base 3 and the length (distance) from the center plane A—A to the reinforcement base 4 are the same. However, in a semiconductor integrated circuit device according to Example 2, the distance from the center plane A—A in the thickness direction of the semiconductor chip 1 to the reinforcement base 4 is different from the distance from the center plane A—A to the carrier base 3.

In other words, the semiconductor integrated circuit device according to Example 2 is constructed so that the distance d1 from the center plane A—A in the thickness direction of the semiconductor chip 1 to the reinforcement base 4 is larger than the distance d2 from the center plane A—A to the carrier base 3 (d1>d2). In FIG. 5, the reference numerals shown in FIG. 1 are used for the same or similar portions.

In this semiconductor integrated circuit device, it is possible to restrict deformation by thermal stress during heat cycling because of the high bending stiffness of the sandwich structure in comparison with the conventional semiconductor integrated circuit device shown in FIG. 10, whereby, when the device is mounted on a printed-wiring board, it is possible to restrict cracks and breakage in the external output terminal 8, in comparison with Example 1.

In Example 2, the center plane of semiconductor chip 1 is not in agreement with the center plane of the sandwich structure, and therefore the carrier base 3 is bound by the semiconductor chip 1 having a lower coefficient of thermal expansion than that of the carrier base 3, in comparison with the reinforcement base 4. The reinforcement base 4 expands more than the carrier base 3 at the time of heating (expansion), whereby the device as a whole is deformed to a convex shape in the upper portion of the device, and, at the time of cooling (contraction) the reinforcement base 4 contracts more than the carrier base 3, whereby the device is deformed to a convex shape in the lower portion of the device. Accordingly, it is possible to restrict deformation as a whole resulting from a temperature change by selecting the shape and the material of the reinforcement base 4 and of the carrier base 3. In other words, the reinforcement base 4 is provided such that:

(1) the coefficient of thermal expansion of the reinforcement base 4 is smaller than that of the carrier base 3; (2) the modulus of elasticity of the reinforcement base 4 is smaller than that of the carrier base 3; (3) the reinforcement base 4 is thinner than the carrier base 3; and (4) the above mentioned (1) through (3) are partly or wholly combined, whereby the thermal stress generated in the reinforcement base 4 and the thermal stress generated in the carrier base 3 can be made the same. Thus the thermal stress generated in the reinforcement base 4 with respect to the center plane A—A in the thickness direction of semiconductor chip 1 and the thermal stress generated in the carrier base 3 with respect to the center plane A—A in the thickness direction of the semiconductor chip 1 are offset, whereby deformation as a whole resulting from the temperature change can be reduced to a low level. Accordingly, the deformation resulting from a thermal stress at the time of heat cycling or the like can be minimized.

EXAMPLE 3

Figure 6:
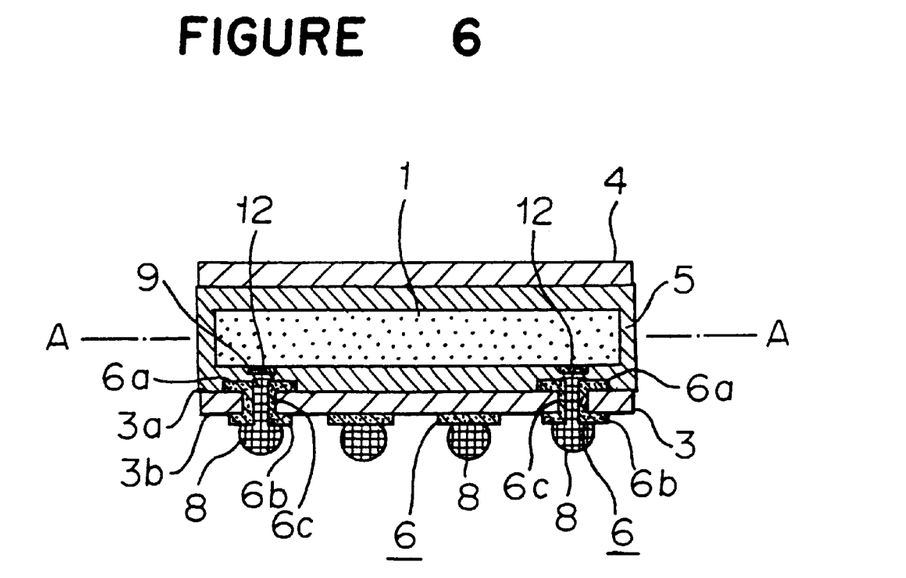
FIG. 6 is a cross-sectional view showing a structure of semiconductor integrated circuit device according to Example 3 of the present invention.

FIG. 6 shows Example 3 of the present invention. Example 3 has a structure similar to that of Example 1 shown in FIG. 1 except for the following points.

In Example 1, the bonding wires 7 are used to connect electrically the connection pads 12 of the semiconductor chip 1 to the inner conductor faces 6a of the conductor 6. Meanwhile, in Example 3, conductive adhesive 9 is directly applied to connect electrically the connection pads 12 of the semiconductor chip 1 to the inner conductor faces 6a of the conductor 6.

In Example 3, the thickness of the sealing resin layer 5 is determined so that a length (distance) between the center plane (plane including a line A—A shown in the Figure) in the thickness direction of the semiconductor chip 1 to the reinforcement base 4 is same as a length (distance) from the center plane to the carrier base 3, as in Example 1. In FIG. 6, the reference numerals shown in FIG. 1 are used for the same or the similar portions.

In this semiconductor integrated circuit device, it is possible to minimize deformation resulting from thermal stress as in Example 1. Even though stress is generated, there is an effect of restricting the deformation using the high bending stiffness of the sandwich structure.

Further, the distance d1 from the center plane A—A in the thickness direction of the semiconductor chip 1 to the reinforcement base 4 and the distance d2 from the center plane A—A to the carrier base 3 are the same. However, the relation between d1 and d2 can be d1>d2 as in Example 2, and/or the reinforcement base 4 can have a different construction from that of the carrier base 3.

EXAMPLE 4

Figure 7:
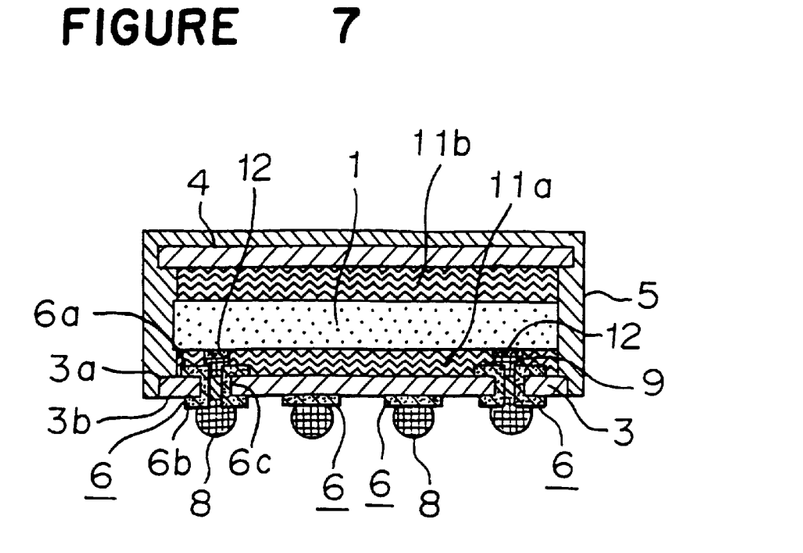
FIG. 7 is a cross-sectional view showing a structure of semiconductor integrated circuit device according to Example 4 of the present invention.

FIG. 7 shows Example 4 of the present invention. Example 4 has a construction similar to that of Example 3 except for the following points. Namely, in Example 3, the device is constructed such that the sealing resin layer 5 is interposed between the semiconductor chip 1 and the carrier base 3 and between the semiconductor chip 1 and the reinforcement base 4. However, in Example 4, it is constructed such that the semiconductor chip 1 is adhered to one surface 3a of the carrier base 3 by a first insulating adhesive layer 11a; the reinforcement base 4 is adhered to one of principal surfaces of the semiconductor chip 1 by a second insulating adhesive layer 11b; and the side surfaces of the semiconductor chip 1, the carrier base 3, the first insulating adhesive layer 11a, the second insulating adhesive layer 11b and the reinforcement base 4 and the upper surface of the reinforcement base are covered by the sealing resin layer 5. In FIG. 7, the reference numerals shown in FIG. 6 are used for the same or similar portions.

In this semiconductor integrated circuit device, it is possible to minimize deformation caused by a thermal stress as in Example 1. Even though the stress occurs, the deformation is restricted by the high bending stiffness of the sandwich structure.

In Example 4, materials of the first insulating adhesive layer 11a and the second insulating adhesive layer 11b are not particularly limited as long as the carrier base 3 and the semiconductor chip 1 are adhered to each other and the reinforcement base 4 and the semiconductor chip 1 are adhered to each other.

Further, in Example 4, the distance d1 from the center plane A—A in the thickness direction of the semiconductor chip 1 to the reinforcement base 4 and the distance d2 from the center plane A—A to the carrier base 3 are the same. However, as in Example 2, d1 and d2 can have a relation of d1>d2, and the structure of the reinforcement base 4 and the structure of the carrier base 3 can be different.

EXAMPLE 5

Figure 8:
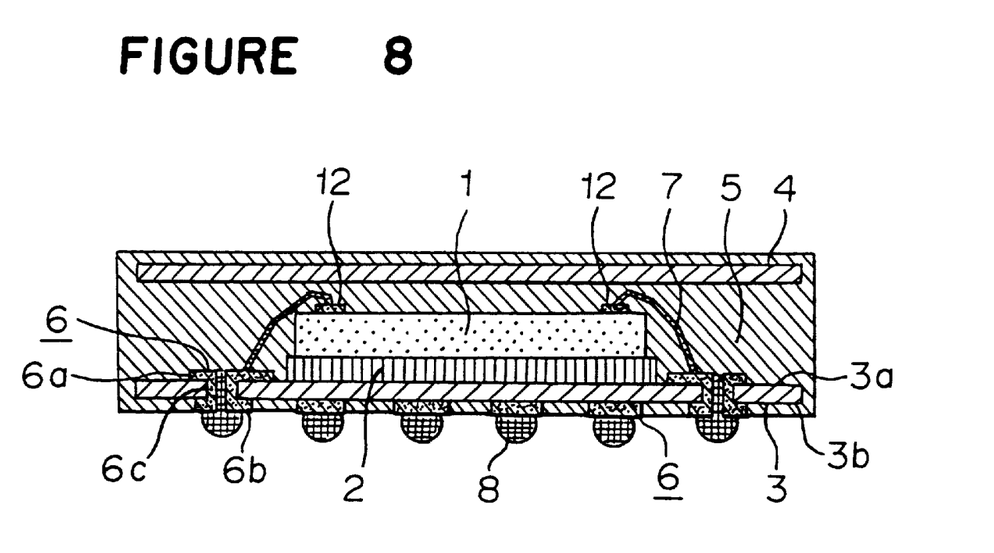
FIG. 8 is a cross-sectional view showing a structure of semiconductor integrated circuit device according to Example 5 of the present invention.

In FIG. 8, Example 5 is shown, which has a structure similar to that of Example 1 except for the following points. Namely, in Example 1, the sealing resin layer 5 exists only between the carrier base 3 and the reinforcement base 4. However, in Example 5, the sealing resin layer 5 covers the upper portion of the reinforcement base 4. In other words, the reinforcement base 4 is embedded in the sealing resin layer 5. In FIG. 8, the reference numerals shown in FIG. 1 are used for the same or the similar portions.

In this semiconductor integrated circuit device, it is possible to minimize deformation caused by thermal stress because of the sandwich structure as in Example 1. Even though the stress occurs, it is possible to obtain dual effects so that the deformation is restricted by the high bending stiffness of the sandwich structure and the reinforcement base 4 is protected by the sealing resin layer 5.

As described in the above, the first aspect of the present invention provides an effect that stiffness against a bending stress is high, and reliability on connection with a printed-wiring board in which the semiconductor integrated circuit device is actually equipped with is high even at the time of heat cycle because a sandwich structure is formed by a core material including a semiconductor chip and a sealing resin layer surrounding the periphery of the semiconductor chip and skin materials of the carrier base and the reinforcement base.

The second aspect of the present invention provides the similar effect to that of the first aspect of the present invention, in addition to the structure of the first aspect of the present invention, because the connection pads of semiconductor chip and the conductors are connected electrically by the bonding wires.

The third aspect of the present invention provides the similar effect to that of the first aspect of the invention, in comparison with the first aspect of the invention, because the connection pads of the semiconductor chip and the conductors are connected interposing the conductive adhesive.

The fourth aspect of the present invention provides the similar effect to that of the first aspect of the invention and further an effect that many external connection terminals can be located in a narrow area in comparison with the first aspect of the invention, because the device is constructed such that the plurality of conductors provided in the one surface of the carrier base are arranged in a matrix-like shape having a plurality of rows and a plurality of columns.

The fifth aspect of the present invention has the similar effect to that of the first aspect of the invention and an effect that the reinforcement base is protected, in comparison with the first aspect of the invention, because the reinforcement base is embedded in the sealing resin layer.

The sixth aspect of the present invention has the similar effect to that of the first aspect of the invention, in comparison with the first aspect of the invention, because there is further provided that the distance from the center plane in the thickness direction of the semiconductor chip is same as the distance from the center plane to the carrier base.

The seventh aspect of the present invention has the similar effect to that of the first aspect of the invention, in addition to the first aspect of the invention, because the carrier base and the reinforcement base have the same shape, and the carrier base and the reinforcement base are arranged symmetrically with respect to the center plane of the sandwich structure.

The eighth aspect of the present invention has a similar effect to that of the first aspect of the invention and further an effect that a thermal stress generated between the device and a printed-wiring board, in which the device is equipped with, can substantially be ignored because the carrier base is formed by fiber-reinforced plastics.

The ninth aspect of the present invention has effects that stiffness against a bending stress is high and reliability on connection to the printed-wiring board, in which the device is equipped with, is high even in the time of heat cycle because the sandwich structure, composed of the core material including the semiconductor chip and the adhesive layer and the skin materials of the carrier base adhered to the semiconductor chip interposing one of the adhesive layers and of the reinforcement base adhered to the semiconductor chip interposing one of the adhesive layers is formed.

The tenth aspect of the present invention has a similar effect to that of the ninth aspect of the invention and further an effect that the semiconductor chip, a surface of the carrier base, the first insulating adhesive layer, the second insulating adhesive layer and the reinforcement base are protected, in addition to the ninth aspect of the invention, because the sealing resin layer is provided so as to cover the semiconductor chip, the surface of the carrier base, the first insulating adhesive layer, the second insulating adhesive layer and the reinforcement base.

The eleventh aspect of the present invention has the similar effect to that of the ninth aspect of the invention because the outer conductor surfaces of the plurality of conductors are arranged on a surface of the carrier base in a grid array shape having a plurality of rows and a plurality of columns.

The twelfth aspect of the present invention has a similar effect to that of the ninth aspect of the invention because the carrier base and the reinforcement base have the same shape, and the carrier base and the reinforcement base are arranged symmetrically with respect to the center plane of the sandwich structure.

The thirteenth aspect of the present invention has a similar effect to that of the ninth aspect of the invention and further an effect that a thermal stress generated between the device and a printed-wiring board, in which the device is equipped with, can substantially be ignored, in addition to the ninth aspect of the invention, because the carrier base is made of fiber-reinforced plastics.

Obviously, numerous modifications and variations of the present invention are possible in light of the above teachings. It is therefore to be understood that within the scope of the appended claims, the invention may be practiced otherwise than as specifically described herein.

What is claimed is:

1. A ball grid array semiconductor integrated circuit device comprising:
   a semiconductor chip having a plurality of connection pads;
   a carrier base having a first surface to which the semiconductor chip is mounted;
   a plurality of conductors, each conductor being electrically connected to a corresponding one of the connection pads, the conductors penetrating through the carrier base from the first surface to an opposite, second surface of the carrier base;
   a plurality of external connection terminals, each external connection terminal having a spherical shape, being disposed on the second surface of the carrier base, and being electrically connected to a corresponding one of the conductors;
   a sealing resin layer surrounding a periphery of the semiconductor chip; and
   a reinforcement base, wherein the semiconductor chip and the sealing resin layer form a core material, the carrier base and the reinforcement base are skin materials sandwiching the core material, the semiconductor chip is located centrally between the carrier base and the reinforcement base, and the carrier base and the reinforcement base have the same coefficient of thermal expansion whereby thermal stresses in the carrier base and the reinforcement base in response to temperature changes are substantially equal.

2. The ball grid array semiconductor integrated circuit device according to claim 1, wherein the plurality of conductors include bonding wires, and further including an adhesive bonding the semiconductor chip to the first surface of the carrier base at a die pad included in the carrier base.

3. The ball grid array semiconductor integrated circuit device according to claim 1, including an electrically conductive adhesive electrically connecting the plurality of connection pads on the semiconductor chip to the plurality of conductors.

4. The ball grid array semiconductor integrated circuit device according to claim 1, wherein the plurality of external connection terminals on the second surface of the carrier base are arranged in a grid array having plural rows and plural columns.

5. The ball grid array semiconductor integrated circuit device according to claim 1, wherein the reinforcement base is embedded in part of the sealing resin layer.

6. The ball grid array semiconductor integrated circuit device according to claim 2, wherein the reinforcement base is embedded in part of the sealing resin layer.

7. The ball grid array semiconductor integrated circuit device according to claim 3, wherein the reinforcement base is embedded in part of the sealing resin layer.

8. The ball grid array semiconductor integrated circuit device according to claim 4, wherein the reinforcement base is embedded in part of the sealing resin layer.

9. The ball grid array semiconductor integrated circuit device according to claim 1, wherein a distance from a center plane with respect to a thickness direction of the semiconductor chip to the reinforcement base equals a distance from the center plane to the carrier base.

10. The ball grid array semiconductor integrated circuit device according to claim 2, wherein a distance from a center plane with respect to a thickness direction of the semiconductor chip to the reinforcement base equals a distance from the center plane to the carrier base.

11. The ball grid array semiconductor integrated circuit device according to claim 3, wherein a distance from a center plane with respect to a thickness direction of the semiconductor chip to the reinforcement base equals a distance from the center plane to the carrier base.

12. The ball grid array semiconductor integrated circuit device according to claim 1, wherein the carrier base is a fiber-reinforced plastic.

13. A semiconductor integrated circuit device comprising:
a semiconductor chip having a plurality of connection pads;
a plurality of conductors, each conductor being electrically connected to a corresponding one of the connection pads;
a plurality of external connection terminals, each connection terminal having a spherical shape and corresponding, respectively, to a corresponding one of the conductors;
a first insulating adhesive layer;
a second insulating adhesive layer;
a carrier base adhered to the semiconductor chip by the first insulating adhesive layer; and
a reinforcement base adhered to the semiconductor chip by the second insulating adhesive layer, wherein the semiconductor chip, the first insulating adhesive layer, and the second insulating adhesive layer form a core material, the carrier base and the reinforcement base have substantially the same size as the semiconductor chip and are skin materials, sandwiching the core material, the connections of the conductors to the connection pads are located at a first surface of the carrier base, the conductors are located in the carrier base, and the external connection terminals are located at a second surface of the carrier base opposite the first surface.

14. The ball grid array semiconductor integrated circuit device according to claim 13, including a sealing resin layer surrounding the semiconductor chip, the first surface of the carrier base, the first insulating adhesive layer, the second insulating adhesive layer, and the reinforcement base.

15. The ball grid array semiconductor integrated circuit device according to claim 13, wherein the plurality of conductors on the second surface of the carrier base are arranged in a grid array having plural rows and plural columns.

16. The ball grid array semiconductor integrated circuit device according to claim 13, wherein the carrier base and the reinforcement base have identical shapes and are arranged in positions symmetrical to a plane centered between the carrier base and the reinforcement base.

17. The ball grid array semiconductor integrated circuit device according to claim 14, wherein the carrier base and the reinforcement base have identical shapes and are arranged in positions symmetrical to a plane centered between the carrier base and the reinforcement base.

18. The semiconductor integrated circuit device according to claim 15, wherein the carrier base and the reinforcement base have identical shapes and are arranged in positions symmetrical to a plane centered between the carrier base and the reinforcement base.

19. The ball grid array semiconductor integrated circuit device according to claim 13, wherein the carrier base is a fiber-reinforced plastic.

20. The ball grid array semiconductor integrated circuit device according to claim 1, wherein the carrier base and the reinforcement base have the same composition.

21. The ball grid array semiconductor integrated circuit device according to claim 1, wherein the carrier base and the reinforcement base have substantially the same size.

22. A ball grid array semiconductor integrated circuit device comprising:
a semiconductor chip having a plurality of connection pads;
a plurality of conductors, each conductor being electrically connected to a corresponding one of the connection pads;
a plurality of external connection terminals, each external connection terminal having a spherical shape and being electrically connected to a corresponding one of to the conductors;
a sealing resin layer surrounding a periphery of the semiconductor chip;
a carrier base having a first surface to which the semiconductor chip is mounted; and
a reinforcement base, wherein the semiconductor chip and the sealing resin layer form a core material, the carrier base and the reinforcement base are skin materials sandwiching the core material, the conductors being located at least partly in the carrier base, the external connection terminals being located at a second surface, opposite the first surface, of the carrier base, the semiconductor chip is not located centrally between the carrier base and the reinforcement base, and the carrier base and the reinforcement base have differences in at least one of modulus of elasticity and thickness so that, as a result of the differences, thermal stresses in the carrier base and the reinforcement base in response to temperature changes are substantially equal.

23. The ball grid array semiconductor integrated circuit device according to claim 22, wherein the plurality of conductors include bonding wires, and further including an adhesive bonding the semiconductor chip to the first surface of the carrier base at a die pad included in the carrier base.

* * * * *